(12) United States Patent
Yang

(10) Patent No.: US 7,777,415 B2
(45) Date of Patent: Aug. 17, 2010

(54) SEALED, FLEXIBLE FLAT PANEL DISPLAY

(75) Inventor: Nam-Choul Yang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 738 days.

(21) Appl. No.: 11/281,703

(22) Filed: Nov. 18, 2005

(65) Prior Publication Data
US 2006/0108920 A1    May 25, 2006

(30) Foreign Application Priority Data
Nov. 25, 2004    (KR) .................. 10-2004-0097521

(51) Int. Cl.
*H01J 1/62*    (2006.01)
*H05B 33/04*    (2006.01)

(52) U.S. Cl. .................. 313/512; 313/506; 313/504; 313/511; 349/58; 349/155

(58) Field of Classification Search .................. 313/511, 313/512
See application file for complete search history.

(56) References Cited

U.S. PATENT DOCUMENTS

| 3,157,813 A | 11/1964 | Bowser et al. | |
|---|---|---|---|
| 4,597,635 A | 7/1986 | Hoshikawa | |
| 4,999,936 A * | 3/1991 | Calamia et al. | ................ 40/544 |
| 5,686,360 A * | 11/1997 | Harvey et al. | .................. 438/28 |
| 6,268,695 B1 | 7/2001 | Affinito | |
| 6,377,324 B1 | 4/2002 | Katsura | |
| 6,413,645 B1 | 7/2002 | Graff et al. | |
| 6,497,598 B2 | 12/2002 | Affinito | |
| 6,522,067 B1 | 2/2003 | Graff et al. | |
| 6,548,912 B1 | 4/2003 | Graff et al. | |
| 6,570,325 B2 | 5/2003 | Graff et al. | |
| 6,573,652 B1 | 6/2003 | Graff et al. | |
| 6,577,496 B1 * | 6/2003 | Gioscia et al. | ........... 361/679.3 |
| 6,624,570 B1 * | 9/2003 | Nishio et al. | ................ 313/506 |
| 2003/0027369 A1 | 2/2003 | Yamazaki | |
| 2006/0138913 A1 * | 6/2006 | Kim et al. | ................ 312/223.1 |

FOREIGN PATENT DOCUMENTS

| JP | 58-005720 A1 | 1/1983 |
|---|---|---|
| JP | 58-085416 A1 | 5/1983 |
| JP | 05-144569 | 6/1993 |
| JP | 05-242966 A1 | 9/1993 |
| KR | 10-2003-0002946 | 1/2003 |

* cited by examiner

*Primary Examiner*—Sikha Roy
(74) *Attorney, Agent, or Firm*—H.C. Park & Associates, PLC

(57) ABSTRACT

A flat panel display including a light emitting device having a sealed image display area. An enclosure is curved to have a space in which the light emitting device is sealed, and a curved portion of the enclosure is rounded.

15 Claims, 4 Drawing Sheets

SEALED, FLEXIBLE FLAT PANEL DISPLAY

CROSS-REFERENCE TO RELATED APPLICATIONS

This application claims priority to and the benefit of Korean Patent Application No. 10-2004-0097521, filed on Nov. 25, 2004, which is hereby incorporated by reference for all purposes as if fully set forth herein.

BACKGROUND OF THE INVENTION

1. Field of the Invention

The present invention relates to a flat panel display and a method of manufacturing a flat panel display, and more particularly, to a sealed, flexible flat panel display and a method of manufacturing the sealed, flexible flat panel display.

2. Discussion of the Background

Generally, some flat panel displays (FPDs), such as, organic electroluminescent displays (OELDs), thin film transistor liquid crystal displays (TFT-LCD), etc., may have characteristics allowing them to be made thin and flexible. Accordingly, much research is being conducted into thin, flexible FPDs.

A flexible substrate is used to produce thin, flexible FPDs, and a plastic substrate is typically used as the flexible substrate.

However, because FPDs undergo complicated manufacturing processes, such as formation of an organic film, a thin film transistor layer, an electrode layer, an orientation layer, etc., on a substrate, depending on the particular characteristics of the FPD, when using a plastic substrate, such processes may deform the plastic substrate or thin layers formed on the plastic substrate. Also, plastic is generally less dense than glass.

Furthermore, a plastic substrate may not effectively prevent permeation of water or air.

To solve this problem, a plastic substrate may be coated with a barrier layer to block permeation of water or air.

For example, U.S. Pat. Nos. 6,268,695 and 6,497,598 disclose an organic light emitting device encapsulated in a film including polymer layers and a ceramic layer interposed between the polymer layers. U.S. Pat. No. 6,413,645 discloses an organic light emitting device encapsulated in a stack of at least one polymer layer and at least one inorganic layer. U.S. Pat. No. 6,522,067 discloses an organic light emitting device encapsulated in a stack of at least one barrier layer and at least one polymer layer. U.S. Pat. No. 6,548,912 discloses a micro-electronic device encapsulated in a stack of at least one barrier layer and at least one polymer layer. U.S. Pat. No. 6,570,325 disclosed an organic light emitting device encapsulated in a stack where a barrier layer is interposed between decoupling layers. U.S. Pat. No. 6,573,652 discloses a display device encapsulated in a stack of at least one barrier layer and at least one polymer layer.

However, using such a barrier layer, which includes an inorganic film, to encapsulate an FPD, the barrier layer may be too thin, which may degrade its durability. Even when the barrier layer is formed on a flexible plastic substrate, the limit of a process temperature is low, so that manufacturing the FPD may be difficult.

Thus, there is room for improvement in sealing display devices in flexible FPDs.

Korean Patent Publication No. 2003-2946 discloses an organic light emitting device sealed by plastic that is heated and press-fitted onto the light emitting device instead of being adhered by an adhesive. In this case, although sealing can be simply performed, the plastic may not completely prevent permeation of water and air. This results in degradation of the lifespan and durability of the organic light emitting device.

U.S. Patent Publication No. 2003/0027369 A1 discloses a method of making a light emitting device that is vacuum-sealed with a bag-like plastic film inside of which inorganic insulating films, which can prevent oxygen or water from penetrating therein, and an organic insulating film, which has a smaller internal stress than the inorganic insulating films, are laminated. However, when the plastic film having the inorganic insulative film bends, the inorganic insulative film may crack, leading to degradation of the ability of preventing permeation of water and air.

Japanese Patent Publication No. 1993-144569 discloses a method of manufacturing a light emitting device that is sealed by forming a thermoplastic hygroscopic film on both sides of the light emitting device, heating and press-fitting the film onto the light emitting device to seal all of the device's peripheral parts, and then covering the sealed light emitting device with an outer cover film. However, the thermoplastic hygroscopic film and the outer cover film may not completely prevent permeation of water and air.

SUMMARY OF THE INVENTION

The present invention provides a flexible flat panel display that may be simply manufactured and that may block water and oxygen, and a method of manufacturing the flat panel display.

Additional features of the invention will be set forth in the description which follows, and in part will be apparent from the description, or may be learned by practice of the invention.

The present invention discloses a flat panel display including a light emitting device having a sealed image display area. An enclosure is curved to have a space in which the light emitting device is sealed, and a curved portion of the enclosure is rounded.

The present invention also discloses a method of manufacturing a flat panel display including forming a light emitting device by forming an image display area on a substrate and sealing the image display area, seating the light emitting device on an enclosure, enclosing the light emitting device with the enclosure, and sealing edges of the enclosure. A supporter is arranged between a curved portion of the enclosure and the light emitting device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
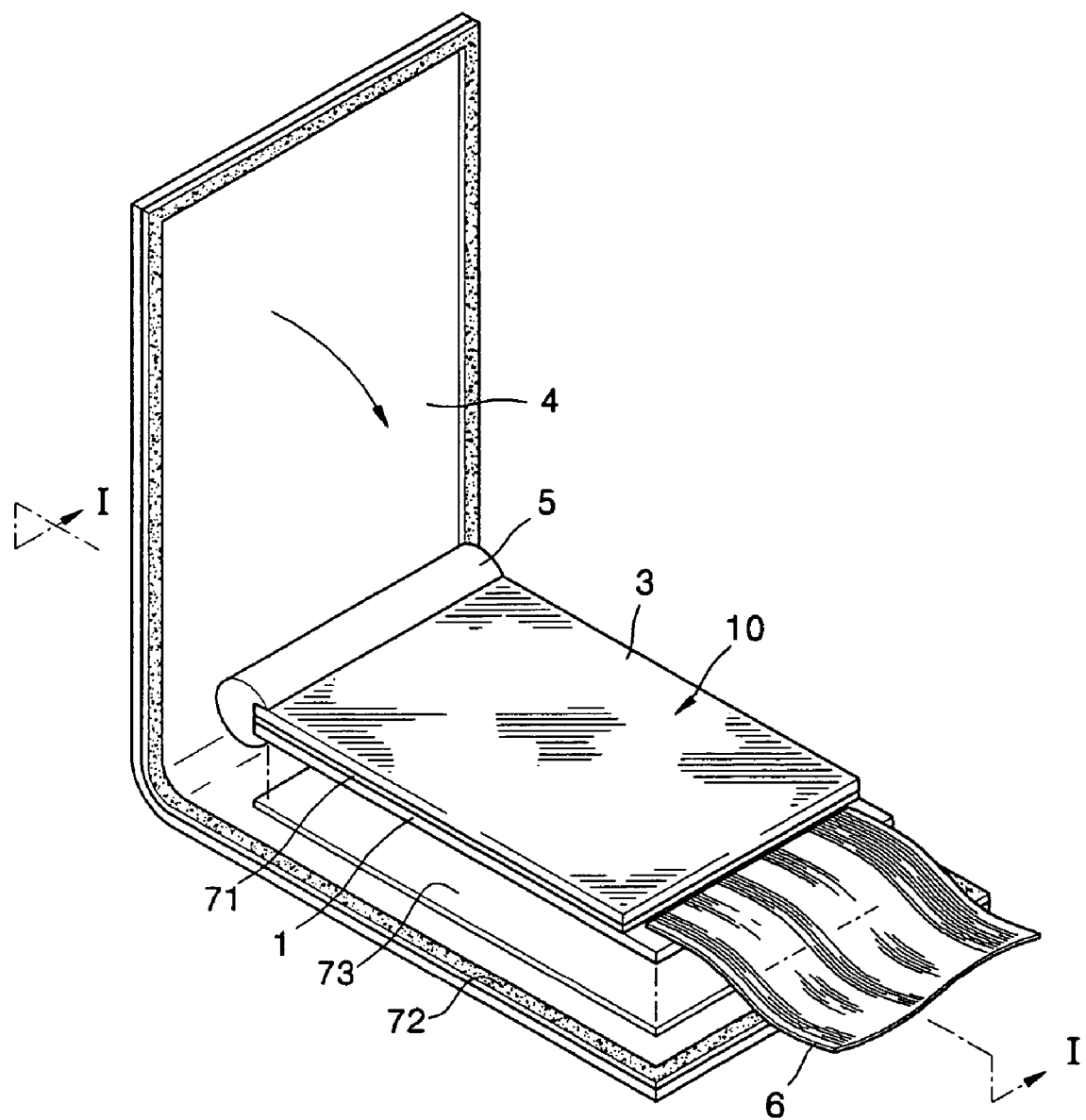
FIG. 1 is an exploded perspective view of a flat panel display according to an embodiment of the present invention.
Figure 2:
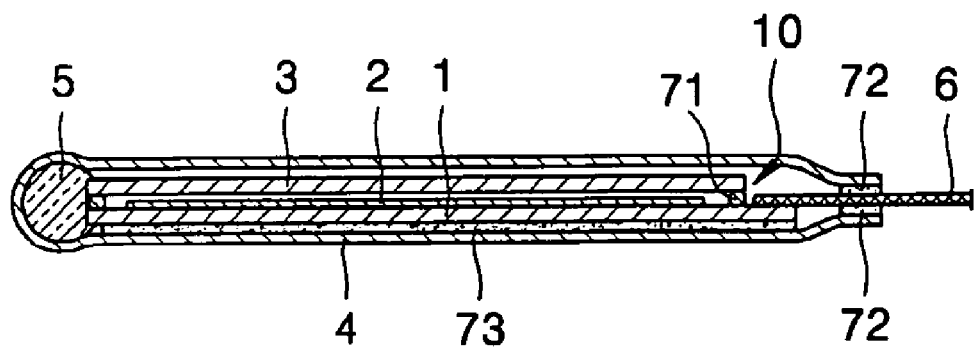
FIG. 2 is a cross-section taken along line I-I of FIG. 1.

FIG. 1 is an exploded perspective view of a flat panel display according to an embodiment of the present invention. FIG. 2 is a cross-section taken along line I-I of FIG. 1. While the flat panel display of FIG. 1 and FIG. 2 is shown as an organic electroluminescent display, it may be one of various types of flat panel displays, such as, liquid crystal displays, inorganic light emitting displays, electron emission displays, etc.

Referring to FIG. 1 and FIG. 2, the flat panel display includes an enclosure 4 and a light-emitting device 10 arranged inside the enclosure 4. At least one supporter 5 may be placed on an edge of the light emitting device 10. The light emitting device 10 includes a substrate 1, an image display portion 2 formed on the substrate 1 and including an organic light-emitting device, and a sealing element 3 coupled to the substrate 1 to protect the image display portion 2 from the external atmosphere.

The image display portion 2, which includes the organic light emitting device, displays an image.

Various types of organic light emitting devices may be used as the organic light emitting device included in the image display portion 2. In other words, a simple passive-matrix (PM) organic light emitting device or an active-matrix (AM) organic light emitting device, which has a thin film transistor (TFT) layer, may be used as the organic light emitting device included in the image display portion 2.

Figure 3:
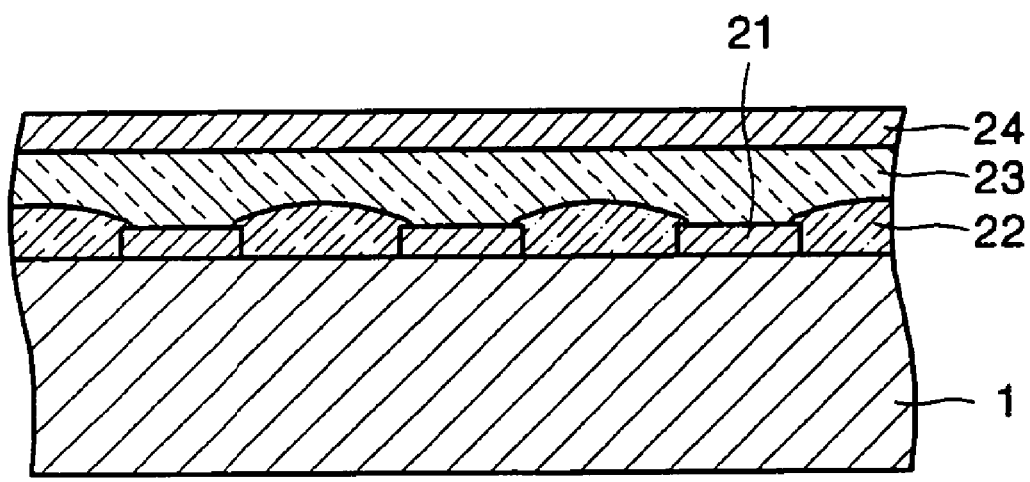
FIG. 3 is a cross-section of an example of an image display portion shown in FIG. 1.

FIG. 3 shows an example of a PM organic light emitting device. Referring to FIG. 3, a first electrode layer 21 is formed on a substrate 1 in strips, and an organic layer 23 and a second electrode layer 24 are sequentially formed on the first electrode layer 21. An insulative layer 22 may be interposed between adjacent first electrode strips 21, and the second electrode layer 24 may be formed in strips that cross the first electrode strips 21 at right angles. The organic layer 23 may be a monomer organic layer or a polymer organic layer. When using a monomer organic layer, a hole injection layer (HIL), a hole transport layer (HTL), an emissive layer (EML), an electron transport layer (ETL), an electron injection layer (EIL), etc. may be stacked in a single or complex structure. The organic material may be various materials including copper phthalocyanine (CuPc), N,N-Di(naphthalene-1-yl)-N,N'-diphenyl-benzidine; NPB, and tris-8-hydroxyquinoline aluminum (Alq3). The monomer organic layer may be formed by vacuum deposition.

A polymer organic layer usually includes an HTL and an EML. The HTL may be PEDOT, and the EML may be formed of a polymer organic material, such as poly-phenylenevinylene (PPV) or polyfluorene, by screen printing, inkjet printing, etc. The first electrode layer 21 serves as an anode electrode, and the second electrode layer 24 serves as a cathode electrode. Alternatively, the first electrode layer 21 may serve as the cathode, and the second electrode layer 24 may serve as the anode.

In front-emission light emitting displays, the second electrode layer 24 may be a transparent indium-tin-oxide (ITO) electrode. In rear-emission light emitting displays, the first electrode layer 21 may be a transparent electrode. The second electrode layer 24 may be produced by forming a thin semi-permeable metal film, such as, Mg, Ag, etc., and depositing transparent ITO on the thin semi-permeable film.

Figure 4:
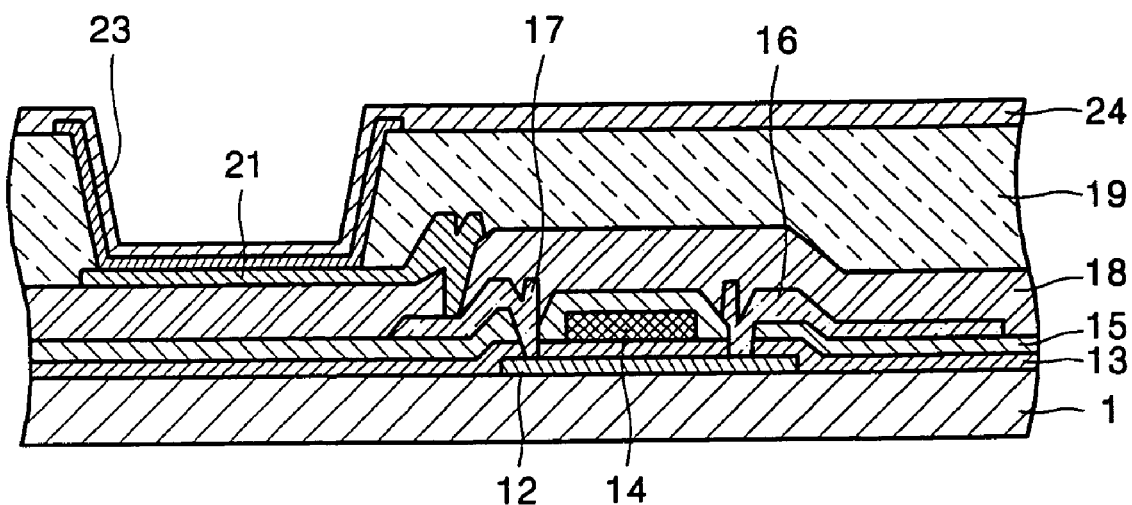
FIG. 4 is a cross-section of another example of the image display portion shown in FIG. 1.

FIG. 4 shows an example of an AM organic light emitting device. Referring to FIG. 4, each pixel of the image display portion 2 shown in FIG. 1 and FIG. 2 has a TFT and a self-luminant electroluminescent (EL) device.

The TFT included in each pixel need not have the exemplary structure shown in FIG. 4. Additionally, the number of TFTs included in each pixel and the structure of each TFT may be changed into various forms. The AM organic light emitting device is described in greater detail below.

As shown in FIG. 4, a TFT is formed on the substrate 1. The TFT includes an active layer 12 formed on the substrate 1, a gate insulating film 13 formed on the active layer 12, and a gate electrode 14 formed on the gate insulating film 13.

An inter-insulator 15 is formed on the gate electrode 14 and the gate insulating film 13. A source electrode 16 and a drain electrode 17 are formed on the inter-insulator 15 and are coupled with a source area and a drain area, respectively, of the active layer 12 via contact holes.

A passivation film 18 of an insulative material is formed on the source and drain electrodes 16 and 17, and an insulative pixel defining film 19 is formed on the passivation film 18. The passivation film 18 may have a single-layered structure or a multi-layered structure.

Although not shown in FIG. 4, at least one capacitor is coupled to the TFT.

A first electrode layer 21, which serves as an anode electrode of an organic light emitting device, is coupled to the drain electrode 17. As shown in FIG. 4, the first electrode layer 21 is formed on the passivation film 18, the pixel defining film 19 is formed on the first electrode layer 21, and an opening is formed in the pixel defining film 19 exposing a portion of the first electrode layer 21. Thereafter, an organic light emitting device, namely, the EL device, is formed. The organic light emitting device may emit red, green or blue light according to an organic material and a flow of current to display image information. The organic light emitting device includes the first electrode layer 21 coupled to the drain electrode 17 of the TFT and receiving positive power from the drain electrode 17, a second electrode layer 24 covering the entire area of each pixel and supplying negative power to the pixel, and an organic layer 23 interposed between the first and second electrode layers 21 and 24 and emitting light.

The first electrode layer 21 may be a reflective electrode including a reflective layer of Ag, Mg, Al, Pt, Pd, Au, Ni, Nd, Ir, Cr, or a compound thereof, and ITO, IZO, ZnO, or $In_2O_3$ on the reflective layer.

The second electrode layer 24 may be a transparent electrode formed by depositing a metal with a small work function, such as Li, Ca, LiF/Ca, LiF/Al, Al, Mg, or a compound thereof, in a direction facing the organic layer 23 and forming an auxiliary electrode layer or a bus electrode line of a material suitable for forming a transparent electrode, such as ITO, IZO, ZNO, or $In_2O_3$, on the metal.

The second electrode layer 24 need not be deposited on the entire surface of each pixel. Rather, it may be formed to have various patterns. As described above, the first and second electrode layers 21 and 24 may be formed in strips that are orthogonal to each other.

The TFT structure and the organic light emitting device structure are not limited to the above-described embodiment as they may be modified into various structures.

The substrate 1 on which the image display portion 2 is formed may be transparent or opaque. Glass or plastic may be used for the transparent substrate 1, and glass, plastic, or metal may be used for the opaque substrate 1. When the substrate 1 is transparent, the image display portion 2 may emit light toward the substrate 1 and/or the sealing element 3. When the substrate 1 is opaque, the image display portion 2 emits light toward the sealing element 3.

In an embodiment of the present invention, the substrate 1 may be flexible. In this case, the substrate 1 may comprise a plastic material. However, the substrate 1 may be made of various materials including thin glass or metal.

For example, plastic materials used to form the substrate 1 may include polyethylene terephthalate (PET), polyethylene naphthalate (PEN), polycarbonate (PC), polyether sulfone (PES), etc.

When the substrate 1 is made of plastic, the image display portion 2 may be formed directly on the substrate 1, as shown in FIG. 3 and FIG. 4, so that a protection layer for protecting the image display portion 2 from water and air is not formed on the substrate 1. Since such a protection layer includes an inorganic layer, which may be difficult to form, it is preferable that a protection layer is not formed on the substrate 1 having the image display portion 2 formed directly thereon.

According to an embodiment of the present invention, the sealing element 3, which seals the image display portion 2, may be transparent or opaque. When the substrate 1 is transparent, the sealing element 3 may be formed of either a transparent material or an opaque material. On the other hand, when the substrate 1 is opaque, the sealing element 3 is formed of a transparent material.

Glass or plastic may be used to form a transparent sealing element 3, and glass, plastic, or metal may be used to form an opaque sealing element 3. In the embodiment of FIG. 1 and FIG. 2, the substrate 1, the image display portion 2, and the sealing element 3 are all shown as having plate shapes.

When the sealing element 3 is a plastic plate, the plastic plate may have no protection layers, as in the case where the substrate 1 is made of plastic. However, the present invention is not limited to this embodiment, and the sealing element 3 may be a plastic plate having a protection layer formed on at least one surface thereof. Such a protection layer will be described in greater detail later.

Edges of the sealing element 3 are coupled to the substrate 1 using a first sealant 71. The first sealant 71 may be a thermosetting adhesive and/or an ultraviolet thermosetting adhesive. Alternatively, the first sealant 71 may be frit glass.

Although not shown in the drawings, a moisture absorbing agent may be included in the space between the substrate 1 and the sealing element 3. The moisture absorbing agent, which absorbs oxygen and water, may be made of barium oxide, calcium oxide, or porous oxide. Examples of the porous oxide include porous silica, hydrated amorphous alumina, or a compound thereof. The hydrated amorphous alumina may be at least one of bohemite (AlOOH) and bayerite (Al(OH)$_3$). The moisture absorbing agent may be any other material that absorbs oxygen and water.

Pads (not shown) coupled to the image display portion 2 are exposed on one end of the substrate 1. A flexible printed circuit-board (FPC) 6 is bonded to the pads. The FPC 6 provides power to the image display portion 2 and is coupled to external electronic devices to provide various signals to the image display portion 2. After forming the light-emitting device 10, the light-emitting device 10 may be seated on the enclosure 4.

An adhering unit 73 may be formed on the enclosure 4, and the substrate 1 of the light-emitting device 10 is bonded to the adhering unit 73 to be seated on the enclosure 4. The adhering unit 73 may be a thermosetting adhesive and/or an ultraviolet thermosetting adhesive. Alternatively, the adhering unit 73 may be double-sided adhering tape. The adhering unit 73 may contain the above-described moisture absorbing agent. Additionally, the adhering unit 73 may be replaced by a moisture absorbing unit, such as, a moisture absorbing agent or a moisture absorbing tape.

After the substrate 1 is seated on the enclosure 4, the enclosure 4 may be bent as shown in FIG. 1 and FIG. 2 to seal the light-emitting device 10. Because the enclosure 4 has a second sealant 72 formed along its edges, two ends of the enclosure 4 may be bonded together. The second sealant 72 may be a thermosetting adhesive and/or an ultraviolet thermosetting adhesive. Alternatively, the second sealant 72 may be frit glass.

Because the enclosure 4 is bent to seal the light-emitting device 10, it is preferred that the enclosure 4 is flexible.

When the enclosure 4 comprises a single sheet to seal the light-emitting device 10, only three portions need to be bonded. Having fewer bonded portions may improve the sealing effect.

Figure 5:
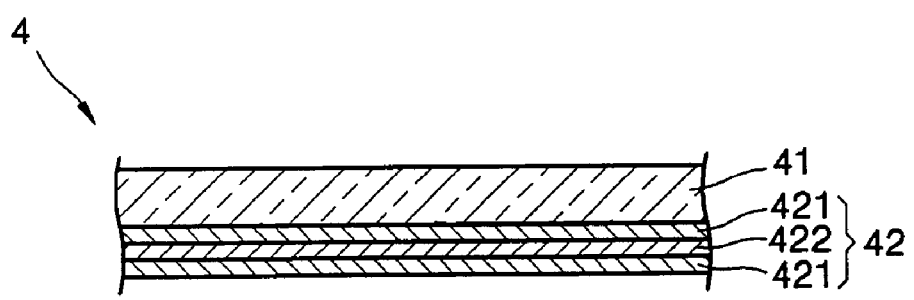
FIG. 5 is a magnified cross-section of a portion of a sealing element shown in FIG. 1.

As FIG. 5 shows, the enclosure 4, may include a base film 41 having a protection layer 42.

According to an embodiment of the present invention, the base film 41 may be made of plastic.

The protection layer 42 may be formed of a transparent material that blocks water and air. The protection layer 42 includes at least one inorganic layer 421, which may be formed of metal oxide, metal nitride, metal carbide, metal oxynitride, or a compound thereof. Examples of the metal oxide include silica, alumina, titania, indium oxide, tin oxide, indium tin oxide, and a combination thereof. Examples of the metal nitride include aluminum nitride, silicon nitride, and a combination thereof. The metal carbide may be a silicon carbide, and the metal oxynitride may be silicon oxynitride. Alternatively, the inorganic layer 421 may be formed of silicon, a ceramic derivative of silicon, or a ceramic derivative of metal. Furthermore, the inorganic layer 421 may be formed of any inorganic material that can block permeation of water and oxygen, for example, diamond-like carbon (DLC).

The inorganic layer 421 may be formed by vacuum deposition. In this case, pores included in the inorganic layer 421 may keep growing. Hence, a polymer layer 422 may be included to prevent the pores from continuously growing at the initial locations. The polymer layer 422 may be formed of an organic polymer, an inorganic polymer, an organometallic polymer, a hybrid organic/inorganic polymer, etc.

The protection layer 42 may be formed on an inside surface of the base film 41, as shown in FIG. 5, and it may also be formed on an outside surface thereof.

The enclosure 4 shown in FIG. 5 is preferably transparent. Hence, the protection layer 42 is also preferably formed of a transparent material.

The enclosure 4 may be sealed by thermal pressing instead of using the second sealant 72. In other words, a part of the enclosure 4 is thermally pressed so that the enclosure 4 may not include the protection layer 42 anymore. This thermal pressing preferably occurs on a part of the enclosure 4 to which the FPC 6 is bonded, because the part of the enclosure 4 can be bonded to the FPC 6.

When the enclosure 4 includes the plastic base film 41 having the protection layer 42, the protection layer 42 can be formed using a separate process. Thus, the process of making an encapsulated organic light-emitting device may be simplified, and the process of forming the protection layer 42 may also be simplified.

When the enclosure 4 having the protection layer 42 is curved as shown in FIG. 1 and FIG. 2, without the supporter 5, the portion of the inorganic layer 421 at the bent portion of the enclosure 4 is folded, which may damage the inorganic layer 421.

Accordingly, in the present invention, the supporter 5 may be interposed between the light emitting device 10 and the enclosure 4 at a location corresponding to the bent portion of the enclosure 4 so that the bent portion of the enclosure 4 is not folded too flat.

An exterior surface of the supporter 5 is rounded so that the enclosure 4 can be smoothly bent along the round exterior surface of the supporter 5. As FIG. 1 shows, the supporter 5 may be coupled to an edge of the light emitting device 10.

The supporter 5 may be formed of metal or plastic. Alternatively, the supporter 5 may be formed by depositing silicon or other like materials and hardening the same. Additionally, the supporter 5 may be fixed on the bent portion of the enclosure 4 instead of being coupled to the light-emitting device 10.

Because the supporter 5 prevents excessive bending of the enclosure 4, the inorganic layer 421 of the protection layer 42 may not be damaged, thereby enhancing blockage of water and air. Additionally, because the supporter 5 covers a lateral side of the light emitting device 10, the supporter 5 can more effectively protect the light emitting device 10 from an external impact.

The space formed by the bent enclosure 4 may be vacuum-sealed or filled with an inert gas. To vacuum-seal the space formed by the bent enclosure 4, the enclosure 4 may be sealed within a chamber that keeps a predetermined vacuum atmosphere. To fill the space formed by the bent enclosure 4 with an inert gas, the enclosure 4 may be sealed within a chamber into which the inert gas is injected.

Alternatively, to vacuum-seal the space formed by the bent enclosure 4, edges of the enclosure 4 may be coated with the second sealant 72, and the enclosure 4 is sealed with at least a portion of the edges of the enclosure 4 open. Thereafter, air may be exhausted from the enclosure 4 through the open portion, and then the open portion of the enclosure 4 is sealed. In this case, sealing occurs twice, but the vacuum sealing of the space formed by the bent enclosure 4 may be smoothly performed. Similarly, to fill the space formed by the bent enclosure 4 with an inert gas, the enclosure 4 is sealed with at least a portion of the edges of the enclosure 4 open, the inert gas is injected into the enclosure 4 through the open portion, and then the open portion of the enclosure 4 is sealed.

Figure 6:
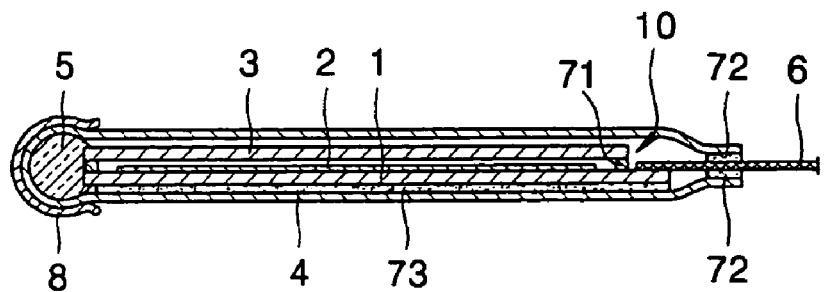
FIG. 6 is a cross-section of a flat panel display according to another embodiment of the present invention.

As FIG. 6 shows, a clip 8 may be further coupled to an exterior surface of the bent portion of the enclosure 4 to more firmly fix the enclosure 4, the light emitting device 10, and the supporter 5.

The clip 8 may be formed of metal or plastic.

Figure 7:
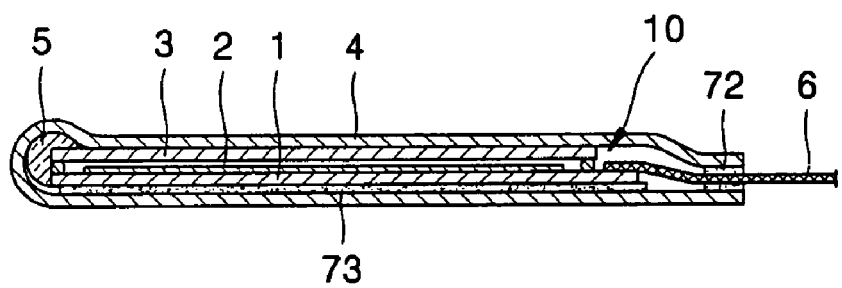
FIG. 7 is a cross-section of a flat panel display according to another embodiment of the present invention.

As FIG. 7 shows, a portion of the enclosure 4 on which the substrate 1 is formed may be flat.

Figure 8:
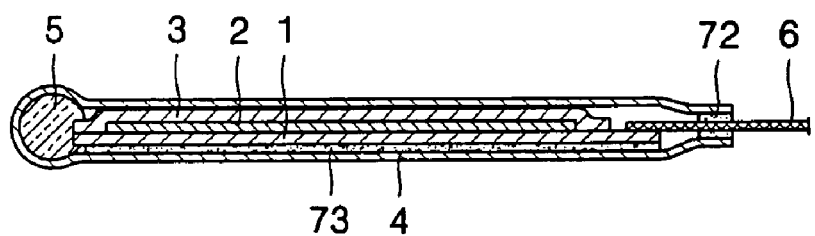
FIG. 8 is a cross-section of a flat panel display according to another embodiment of the present invention.

As FIG. 8 shows, the sealing element 3 may be a sealing film instead of a sealing plate as in the previous embodiments.

In another embodiment of the present invention, the film-shaped sealing element 3 may include at least one inorganic layer and at least one polymer layer. Similar to structure of the enclosure 4, the sealing film 3 may be a plastic film on which a protection layer is formed.

More specifically, the inorganic layer of the sealing film 3 may be formed of a transparent material that blocks water and air, examples of which include metal oxide, metal nitride, metal carbide, metal oxynitride, and a compound thereof. Examples of the metal oxide include silica, alumina, titania, indium oxide, tin oxide, indium tin oxide, and a combination thereof. Examples of the metal nitride include aluminum nitride, silicon nitride, and a combination thereof. The metal carbide may be a silicon carbide, and the metal oxynitride may be silicon oxynitride. Alternatively, the inorganic layer may be formed of silicon, a ceramic derivative of silicon, or a ceramic derivative of metal. Furthermore, the inorganic layer may be formed of any inorganic material that can block permeation of water and oxygen for example, DLC.

The polymer layer included in the sealing film 3 of FIG. 8 may be formed of an organic polymer, an inorganic polymer, an organometallic polymer, a hybrid organic/inorganic polymer, ect.

Embodiments of the present invention may be applied to organic light emitting displays, as well as to other various flat panel displays, such as, liquid crystal displays, inorganic light emitting displays, electron emission displays, etc.

A flat panel display according to an embodiment of the present invention may have the following advantages. First, an ultra thin, flexible flat panel display may be simply manufactured.

Second, a flexible flat panel display may still have high moisture resistance and high air resistance.

Third, sealing is enhanced because fewer edges of an enclosure have to be sealed.

Fourth, the enclosure is bent without a flatly folded portion to prevent damage to a protection layer of the enclosure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display, comprising:
   a light emitting device having a sealed image display area;
   an enclosure being curved to have a space in which the light emitting device is sealed; and
   a supporter coupled to an edge of the light emitting device, the entire supporter being arranged between the light emitting device and a curved portion of the enclosure,
   wherein the curved portion of the enclosure is rounded,
   wherein the edge of the light emitting device contacts the supporter,
   wherein the enclosure comprises a plastic film including an inorganic layer, and
   wherein the inorganic layer is formed of at least one material selected from the group consisting of silicon, metal oxide, metal nitride, metal carbide, metal oxynitride, a ceramic derivative of silicon, a ceramic derivative of metal, diamond-like carbon, and a compound thereof.

2. The flat display panel of claim 1, wherein the curved portion of the enclosure is supported by the supporter.

3. The flat display panel of claim 2, wherein the supporter has a rounded exterior surface.

4. The flat display panel of claim 1, further comprising a clip coupled to an exterior surface of the curved portion of the enclosure.

5. The flat display panel of claim 1, wherein the enclosure is flexible.

6. The flat display panel of claim 1, wherein the enclosure comprises a single sheet.

7. The flat display panel of claim 1, wherein the enclosure comprises three edges where sealing occurs.

8. The flat display panel of claim 1, further comprising an adhering unit interposed between the enclosure and the light emitting device.

9. The flat display panel of claim 1, further comprising a moisture absorbing unit interposed between the enclosure and the light emitting device.

10. The flat display panel of claim 1, wherein the plastic film further includes a polymer layer, the polymer layer being formed of at least one material selected from the group consisting of an organic polymer, an inorganic polymer, an organometallic polymer, and a hybrid organic/inorganic polymer.

11. The flat display panel of claim 1, wherein a sealing element seals the image display area by being coupled to a substrate of the light emitting device; and wherein the substrate is formed of one of glass, plastic, and metal.

12. The flat display panel of claim 1, wherein a sealing element seals the image display area by being coupled to a substrate of the light emitting device; and wherein the sealing element is a plate.

13. The flat display panel of claim 1, wherein a sealing element seals the image display area by being coupled to a substrate of the light emitting device; and wherein the sealing element is a film.

14. The flat display panel of claim 8, wherein the adhering unit contacts the enclosure and a substrate of the light emitting device.

15. The flat display panel of claim 14, wherein the substrate of the light emitting device is arranged directly on the adhering unit only.

* * * * *